United States Patent [19]

Parsons

[11] 3,999,171
[45] Dec. 21, 1976

[54] ANALOG SIGNAL STORAGE USING RECIRCULATING CCD SHIFT REGISTER WITH LOSS COMPENSATION

[75] Inventor: Robert Parsons, St. Neots, England
[73] Assignee: Texas Instruments Incorporated, Dallas, Tex.
[22] Filed: Nov. 17, 1975
[21] Appl. No.: 632,871
[52] U.S. Cl. .................... 340/173 RC; 307/221 D
[51] Int. Cl.² ................ G11C 19/18; G11C 21/00; G11C 27/00
[58] Field of Search ............... 340/173 R, 173 RC; 307/221 C, 221 D; 328/37

[56] References Cited
UNITED STATES PATENTS
3,931,510    1/1976    Kmetz .................... 340/173 RC

*Primary Examiner*—Stuart H. Hecker
*Attorney, Agent, or Firm*—Harold Levine; James T. Comfort; Richard L. Donaldson

[57] ABSTRACT

An analog signal storage system wherein degenerate analog signal storage devices may be used for relatively long time analog data storage. A recirculating charge transfer device shift register is used to store the analog data and a variable gain amplifier is included in a recirculation path between the shift register output and input. The gain of this amplifier is periodically adjusted so as to maintain the overall loop gain of the system at unity. The gain control signal is produced by comparing the amplitudes of a reference signal pulse before and after propagation through the shift register. Based on this comparison, a control signal is generated and applied to adjust the gain of the variable gain amplifier in a sense tending to compensate for signal loss due to propagation through the shift register. The output of the shift register may be strobed to read out analog signal data for external utilization at a lower rate than the propagation rate through the shift register.

14 Claims, 3 Drawing Figures

ANALOG SIGNAL STORAGE USING RECIRCULATING CCD SHIFT REGISTER WITH LOSS COMPENSATION

This invention relates to an analog signal storage system, and in particular to such a system for storing analog signal samples.

There are many applications for the storage of a succession of signal samples, for example, derived by sampling a variable electrical signal, and until recently it has been necessary to convert the signal samples to digital form so that they can be stored in a conventional digital store. However, a form of shift register, generically known as charge transfer device shift registers, has been developed having stages which can store analog signal samples. One such store uses capacitors on which the signal samples are stored and transfer circuits for shifting the stored samples along the register from one capacitor to the next. Another such register is that known as a charge coupled device (CCD) which operates on a similar principle, but is constructed using integrated circuit technology. These stores are such that the stored signal samples must be continually progressed from one stage to the next to avoid appreciable signal decay whilst the signal samples are stored in any particular stage.

A disadvantage of such storage systems is that the transfer from one stage to the next is not absolutely accurate, but usually results in a minute reduction (typically a small fraction of one percent) in the stored signal samples as they are shifted from one stage to the next. This reduction becomes particularly disadvantageous if the shift register is connected to form a recirculating store because of the progressive reduction in amplitude of the signal samples depending on the number of transfers and therefore depending on the period of storage.

It is an object of the present invention to provide a storage arrangement for a succession of analog signal samples in which the above disadvantage is reduced.

According to the present invention there is provided a storage arrangement for a succession of analog signal values including a multi-stage charge transfer device analog shift register, means for propagating the signal values in the shift register from a first stage to a last stage thereof, controllable gain means connected in a series path for the signal values with the shift register, means for applying a reference signal value of particular magnitude to the first stage of the shift register with the particular magnitude, the output of the comparing means being applied to control the gain of the controllable gain means in a sense tending to compensate for variations in signal value due to propagation through the shift register.

In one example of the invention the controllable gain means is an amplifier having controllable gain which is connected in a recirculation path from the last stage of the shift register to the first stage so that progressive variation in the signal values due to recirculation is reduced. In a recirculating storage arrangement the reference signal may be selected either before or after passage through the controllable gain means for comparison with the particular magnitude. The reference signal value may be entered at a particular time and selected by gating the signal value at a corresponding time after propagation through the shift register. Alternatively, the reference signal value may be outside the range of values of the analog signal values stored in the shift register so that it can be selected by virtue of its unusual magnitude or polarity.

The output of the comparing means should have a storage device or other arrangement for maintaining the gain of the controllable gain means at the level determined by the comparison of the reference signal value with the particular magnitude until a subsequent comparison.

In order that the invention may be fully understood and readily carried into effect, embodiments thereof will now be described by way of example only, with reference to the accompanying drawings, of which:

Figure 1:
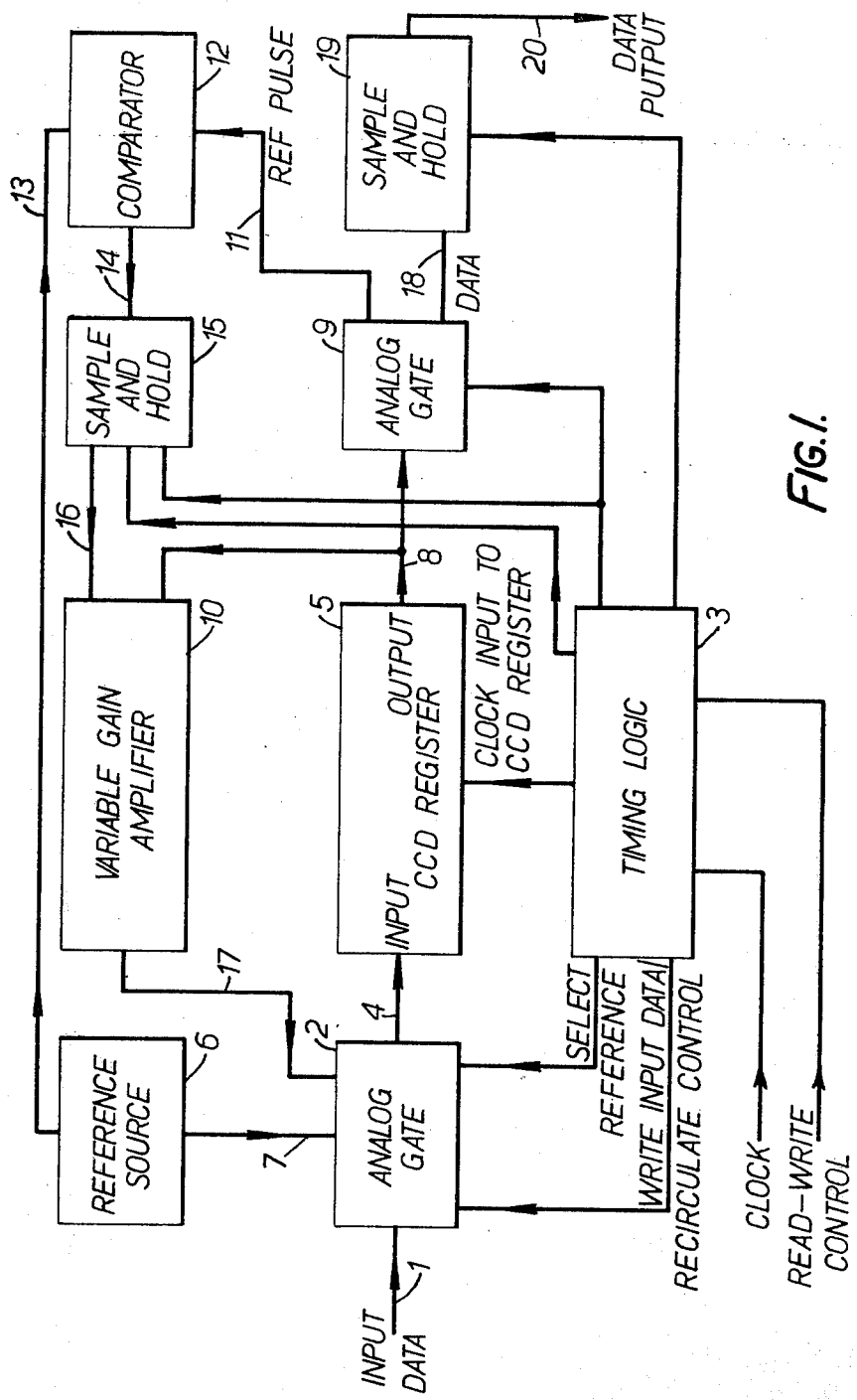
FIG. 1 is a block diagram of one example of the invention.

In FIG. 1, input data in the form of a continuously varying analog signal is applied via a conductor 1 to an analog gate 2 which samples the input data at times determined by a timing logic circuit 3 and applies the sample values through a conductor 4 to a CCD shift register 5. Suitable CCD shift register structures as well as input and output structures for inputting signal values from the conductor 4 into the shift register and for extracting signal values from the shift register on to the conductor 8 are well known in the art. Reference signal samples are interleaved with the analog signal values on the conductor 4 by the analog gate 2 under control of the timing logic circuit 3. The reference signal values are determined by a reference source 6 which is connected by a conductor 7 to the analog gate 2. After propagation through the register 5 by clock signals from the timing logic circuit 3 the analog signal samples and reference signal samples appear on a conductor 8 and are applied to an analog gate 9 and the input of a variable gain amplifier 10. The gate 9 is controlled by the timing logic circuit 3 to apply the reference signal samples via a conductor 11 to a comparator 12 where the amplitude of the reference signal samples is compared with the particular value determined by the source 6 which is connected by a conductor 13 to the comparator 12. A control signal, dependent upon the relative values of the inputs to the comparator, appears on a conductor 14 and is sampled and held by a sample and hold circuit 15 under control of signals from the timing logic circuit 3. The control signal value stored in the circuit 15 is applied via a conductor 16 to control the gain of the amplifier 10. Output signals from the shift register 5 are thus amplified by amplifier 10 to an extent determined by the control signal value and fed along a conductor 17 to the analog gate 2 for recirculation through the shift register 5 with fresh reference signal values interposed by the input to the gate 2 from the reference source 6. A second output 18 of the gate 9 is connected to a sample and hold circuit 19 controlled by the timing logic circuit 3 to produce a reconstituted data output signal on a conductor 20 based on the analog signal values stored by the shift register 5.

In the operation of the circuit of FIG. 1, the analog signal samples from gate 2 are applied successively to the input of the shift register 5, and periodically under the control of the timing logic circuit 3 reference signal samples are inserted into the register 5 interleaved with the analog signal samples. The reference signal samples may, for example, be inserted one for every hundred analog signal samples, or possibly one for every thousand such samples. The analog signal samples appearing at the output 8 of the register 5 are recirculated to its input through the amplifier 10 by which they are amplified by an amount depending upon the control signal value held in the sample and hold circuit 15. The analog gate 9 is controlled by the timing logic circuit 3 so as to apply the reference signal samples along the conductor 11 to the comparator 12 where they are compared with their original value derived from the source 6, and a control signal is produced by the comparator 14 which is stored in the sample and hold circuit 15 to regulate the gain of the amplifier 10 in a sense to correct for signal attenuation introduced by the propagation along the shift register 5.

It is necessary that the reference signal samples be interleaved with the analog signal samples at a sufficiently high frequency to enable the gain of the amplifier 10 to be controlled so as to follow variations in the output signal levels from the register 5. It would be possible for the reference signal samples after amplification by the variable gain amplifier 10 to be gated by the gate 2 to recirculate with the analog signal samples, and indeed such an arrangement would be preferable in that this will bring the gain of the amplifier 10 into a control loop, because the reference signal values as applied to the comparator 10 would have been amplified by the amplifier 10 and consequently variations in its gain due to extraneous causes other than the signal would be monitored by the comparator 12.

The rates of the input and output data of the circuit of FIG. 1 need not be the same, since the timing logic circuit may be arranged to control the gates 2 and 9 so as to enter samples into the register 5 or read samples from it by a strobing technique. For example, if the register 5 has storage for one thousand samples and it is being clocked at a rate of 1 MHz, it would normally be read in 1 mS. However, by strobing the output of the register at intervals of 1.001 mS the complete contents of the register would be read out in 1 second. Thus the circuit of FIG. 1 can be used to accelerate or retard the data rate of the sample values as well as providing storage.

Figure 2:
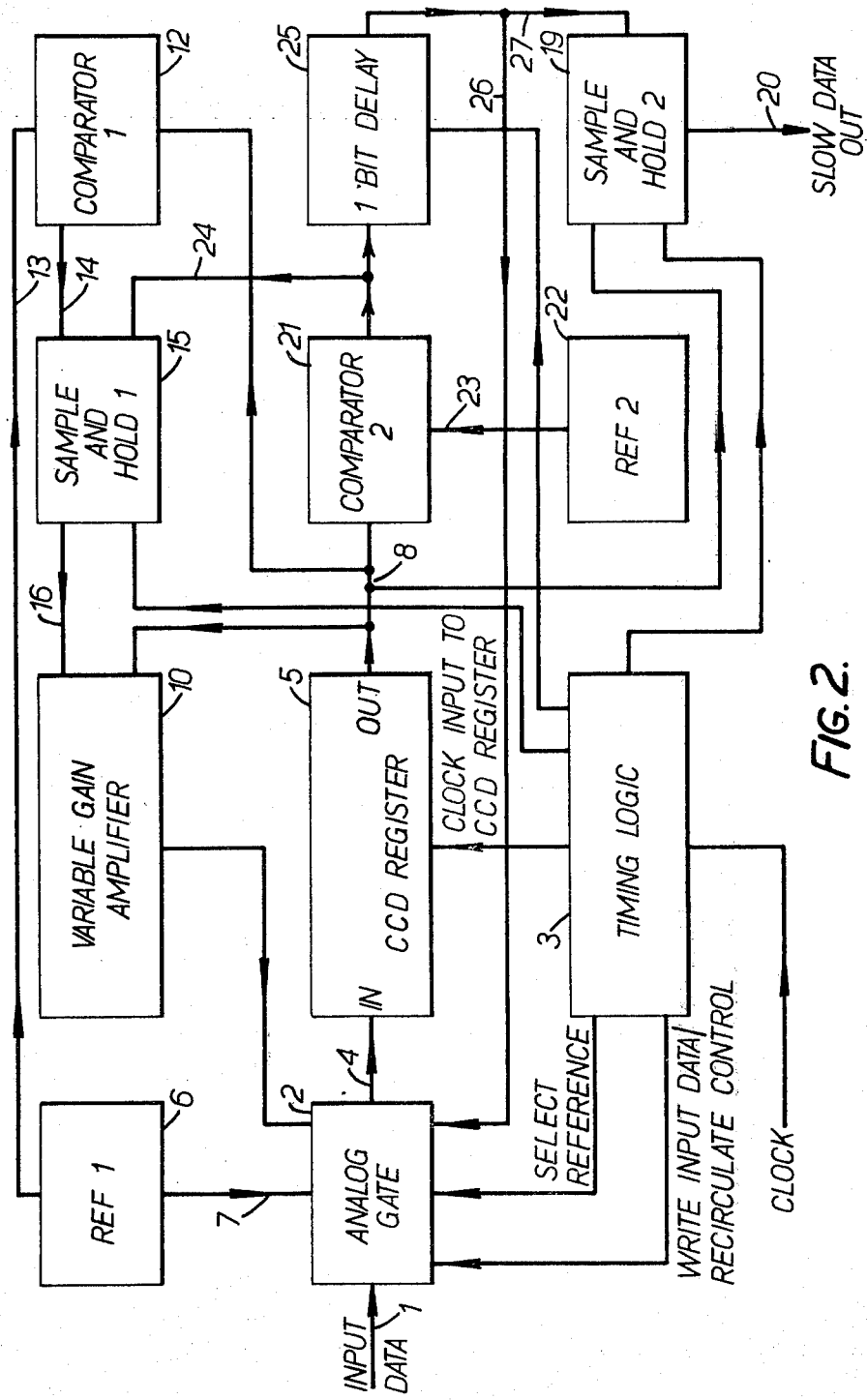
FIG. 2 shows a second example of the invention.

FIG. 2 shows a modification of the circuit of FIG. 1 in which instead of selecting the reference signal samples by timing, they are arranged to have an amplitude different from the range of the analog signal values, so that reference values can be selected by, for example, amplitude or polarity. In FIG. 2 the components which correspond to those of FIG. 1 have the same references as in that figure.

Referring now to FIG. 2, it will be seen that the analog gate 9 of FIG. 1 which controlled the routing of the signal values from the shift register 5 to the comparator 12 or to the sample and hold circuit 19 has been replaced by a second comparator 21 having inputs connected to a second reference signal source 22 by a conductor 23 and to the shift register output by conductor 8. The output of the comparator 21 is connected via a conductor 24 to the sample and hold circuit 15, and also by a one-bit delay circuit 25 via conductors 26 and 27 to the analog gate 2 and the sample and hold circuit 19 respectively. Thus the sample and hold circuits 15 and 19 are utilized to provide a gating action by inhibiting the response of the sample and hold circuit to signals not having correct amplitudes.

As far as the control of the gain of the amplifier 10 is concerned, the operation, of FIG. 2 is the same as described above for FIG. 1. However, all of the output signals from the register 5 are applied to the comparator 12 but, of course, many of these having values very different from those expected of the reference signal value will cause the comparator 12 to produce a large output signal on the conductor 14. However, the circuit 15 is inhibited from responding to these signals any by virtue of the connection from the comparator 21 via the conductor 24, the sample and hold circuit 15 is enabled to respond only to the output signal of the comparator 12 when the reference signal value appears on the conductor 8 and is applied via this conductor to the comparator 12. A second reference source 22 is provided to allow for attenuation of the reference signal value due to its propagation through the register 5, which attenuation would render the use of the source 6 unsuitable for this application. However, instead of a separate source 22 as shown, a signal may be derived from the source 6 and after attenuation or reduction in some other way applied to the comparator 21.

The use of strobing of the output signals of the register 5 was referred to above with the view to slowing down the data rate fed into or derived from the circuit of FIG. 1. The one-bit delay circuit 25 in FIG. 2 is provided for this purpose. An output from the comparator 21 indicating that a reference signal value has appeared on the conductor 8 is applied after a one-bit delay to the analog gate 2 and to the sample and hold circuit 19. The sample and hold circuit 19 therefore reads the analog signal sample immediately following the reference signal sample and produces a corresponding output signal on the output conductor 20. At the same time the gate 2 enters a reference signal pulse in the position in the register 5 previously occupied by the analog signal sample just read out. It will be apparent therefore that the reference signal sample progresses stage by stage backwards through the samples in the register 5 and results in the slow strobed reading of the data store in the register 5 similar to that described with reference to FIG. 1.

Figure 3:
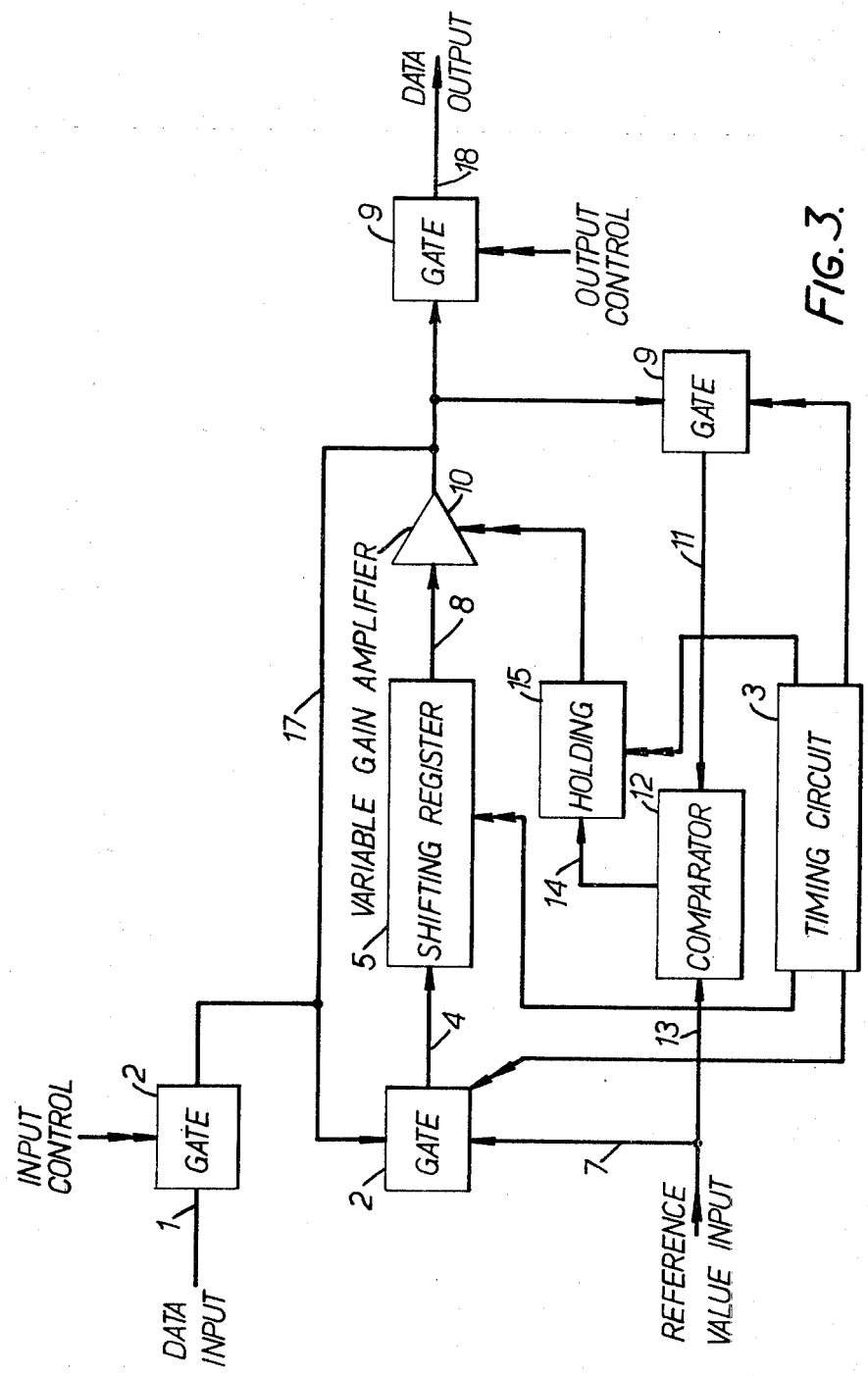
FIG. 3 shows a third example of the invention.

FIG. 3 shows a modification of the circuit of FIG. 1 in which the output of the amplifier 10 is applied to the comparator 12 via the analog gate 9, so that the gain of the amplifier 10 is controlled in a feedback loop and the recirculation of the reference signal pulses is not necessary to correct for any extraneous variations in the gain of the amplifier 10, as was necessary in the circuit of FIG. 1. As before, components of FIG. 3 which correspond to those of FIG. 1 have the same references as in FIG. 1, and it will be seen that, apart from the alteration in the connection of the input to the comparator 12, the only other change which has been made is the division of the gates 2 and 9 each into two separate gates.

Although the invention has been described with reference to certain specific examples, it is not limited to these examples and other circuit arrangements will be evident to those skilled in the art. In particular, the use of reference signal pulses identifiable by their amplitude of their polarity may be used in the circuit of FIG. 3, and in addition the strobing of input and/or output signals can be used to enable slower data rates to be entered or read from the circuit.

The analog gates 2 and 9 may be constructed using field effect transistors, many suitable designs having been proposed. The reference sources 6 and 22 may include zener or avalanche diodes to set the voltage levels. Various suitable designs of variable gain amplifier have been proposed, one such using a double balanced long-tailed pair (balanced amplifier) circuit. A long-tailed circuit may also be used for the comparator 12 or 21. The sample and hold circuits 15 and 19 may each be formed from an analog gate the output of which is connected through a source follower to a capacitor for storing the voltage.

As described above the register 5 is a shift register receiving a serial input and producing a serial output. In a modification of the described arrangements this register is replaced by a number of charge transfer device shift registers which are clocked in parallel at a slower rate, with serial to parallel conversion means at the input distributing the input signal values to the registers in turn and parallel to serial conversion means at the output reforming the signal values into a single stream. Such an arrangement is commonly referred to as an SPS analog memory and a typical mode of operation is described in "Electronics", Aug. 8, 1974, pages 91 to 101.

In the foregoing description it has been assumed that the incoming data is timed conveniently to permit the insertion of the reference signal periodically. For a continuous input signal value stream, means would be required to increase the signal value rate through the CCD shift register to allow time for the reference signals in addition, and to slow down the signal value rate after propagation through the shift register and extraction of the reference signals to regenerate the original data. One way of achieving this is to provide two CCD shift registers to which successive input signal values are applied alternately with the reference signal value being applied periodically to the register to which the signal values are not being applied at the time. Discrete batches of data can be entered into and read from an arrangement according to the invention, the recirculation path being disabled at read-out to prevent continued retention of the data.

This invention can be applied to any kind of shift register having stages capable of storing analog signal values, for example, charge transfer devices, bucket brigade circuits or charge coupled devices. The register may be constructed in discrete or integrated circuit form.

Although as described above the reference signal has the same duration as the data signals, it is possible for the reference signal to be of longer duration by entering the value in a plurality of adjacent stages of the register. This longer duration of the reference signal could provide an additional criterion for selecting it from the data signals.

What is claimed is:
1. An analog signal storage system for a succession of analog signal samples including a multi-stage analog shift register, means for inputting signal samples into said shift register, means for propagating said signal samples along said shift register from a first stage to a last stage thereof, controllable gain means connected in a signal path for the signal samples in series with said shift register, means for inputting a reference signal of predetermined magnitude to the first stage of said shift register and comparing means for comparing the reference signal after propagation through the shift register with said predetermined magnitude, means for applying an output of the comparing means to control the gain of said controllable gain means in a sense to tend to compensate for variations in signal amplitude caused by propagation through said shift register.

2. A storage system according to claim 1 wherein said controllable gain means is connected in a signal path from said last stage of the shift register to said first stage for recirculating signal samples through said shift register.

3. A storage system according to claim 2 including an output path for signal samples connected to the last stage of the shift register.

4. A storage system according to claim 1, including a signal sample output path connected to the output of the controllable gain means.

5. A storage system according to claim 1, including means for selectively controlling said means for applying the reference signal to the first stage of said shift register at selected times, and means connected to the last stage of said shift register for extracting the reference signal and applying it to said comparing means at times following said selected times after an interval equal to the signal propagation time through said shift register.

6. A storage system according to claim 1, wherein said reference signal is characterized by a value outside the range of or polarity different from the analog signal samples, and means connected to the last stage of said shift register adapted to respond to said characteristic to extract the reference signal value and apply it to said comparing means.

7. A storage system according to claim 1, including means for inputting said reference signal to the first stage of said shift register at regular intervals of the order of signal propagation time through said shift register, and means for applying the output of said comparing means to a hold circuit for maintaining the gain of said controllable gain means constant throughout one of said regular intervals.

8. A storage according to claim 1, wherein said controllable gain means is a controllable gain amplifier.

9. An arrangement according to claim 1, wherein the shift register is a charge coupled device shift register.

10. Analog signal storage system for storing a succession of analog signal samples including a multi-stage charge transfer device analog shift register characterized by signal propagation loss; means for inputting analog signal samples into said shift register; means for extracting signal samples from said shift register; means for propagating signal samples along said shift register; signal sample recirculation means for connecting said signal extraction means and said signal inputting means; said recirculation means including controllable gain signal amplifier means; a reference signal source means; means for selectively inputting reference signal samples from said reference signal source into said shift register at preselected intervals; signal comparator means having a first input connected to said reference signal source means and a second input connected to said signal extraction means for receiving reference signal samples after propagation through said shift register, said comparator means adapted to generate control signals having a value dependent on the relative values of said inputs thereto; means connected to said comparator means to apply said control signals to said controllable gain signal amplifier for adjusting the gain of said amplifier means in a sense tending to compensate for variations in analog signal sample amplitude caused by said shift register propagation loss; and output means connected to said signal extraction means for selectively deriving analog signal outputs from said shift register for external utilization.

11. Analog signal storage system according to claim 10, further including analog signal gating means connecting said signal extraction means to said second input of said comparator means for application thereto of said reference signal samples after propagation through said shift register, said gate means further connecting said signal extraction means to said output means for selectively deriving said output signal samples from said shift register.

12. Analog signal storage system for storing a succession of analog signal samples including a multi-stage charge transfer device analog shift register characterized by signal propagation loss and a propagation delay period, means for inputting analog signal samples into said shift register, means for extracting signal samples from said shift register; means for propagating signal samples along said shift register; signal sample recirculation means connecting said signal extraction means and said signal inputting means for recirculation of analog signal samples through said shift register; said recirculation means including controllable gain signal amplifier means; reference signal source means; means for selectively inputting reference signal samples from said reference signal source into said shift register at preselected times; signal comparator means having a first input connected to said reference signal source means and a second input; means connecting said signal extraction means to said second input for applying thereto reference signal samples after propagation through said shift register and at times following said preselected times by an interval equal to said propagation delay period, said comparator means adapted to generate control signals having a value dependent on relative values of said inputs thereto; control signal sample and hold means connecting the output of said comparator means to said controllable gain signal amplifier means for applying said control signal thereto for adjusting the gain of said amplifier means in a sense tending to compensate for variations in analog signal amples amplitude caused by said shift register propagation loss and for maintaining the gain of said amplifier constant throughout one of said regular intervals; and output means connected to said signal extraction means for selectively deriving analog signal sample outputs from said shift register for external utilization.

13. Analog signal storage system according to claim 12, including gating means connecting an output of said controllable gain amplifier means to said second input of the comparator means for application thereto of said reference signals after propagation through said shift register, and wherein said output means is connected to said output of the controllable gain amplifier means.

14. Analog signal storage system according to claim 12, further including analog signal gate means connecting said signal extraction means to said second input of said comparator means for application thereto of said reference signal samples after propagation through said shift register, said gate means further connecting said signal extraction means to said output means for selectively deriving said output signal samples from said shift register.

* * * * *